(12) United States Patent
Suzuki et al.

(10) Patent No.: US 7,434,913 B2
(45) Date of Patent: Oct. 14, 2008

(54) INKJET HEAD, METHOD FOR PRODUCING INKJET HEAD, INKJET RECORDER AND INKJET COATER

(75) Inventors: Yoshinari Suzuki, Ibaraki (JP); Hiroshi Sasaki, Ibaraki (JP)

(73) Assignee: Ricoh Printing Systems, Ltd., Tokyo (JP)

( * ) Notice: Subject to any disclaimer, the term of this patent is extended or adjusted under 35 U.S.C. 154(b) by 518 days.

(21) Appl. No.: 11/172,828

(22) Filed: Jul. 5, 2005

(65) Prior Publication Data

US 2006/0012656 A1    Jan. 19, 2006

(30) Foreign Application Priority Data

Jul. 6, 2004    (JP) .......................... P. 2004-199432
Mar. 15, 2005    (JP) .......................... P. 2005-073362

(51) Int. Cl.
*B41J 2/135* (2006.01)

(52) U.S. Cl. .......................................... 347/45; 347/47

(58) Field of Classification Search .................. 347/20, 347/44, 45, 47, 63, 64
See application file for complete search history.

(56) References Cited

U.S. PATENT DOCUMENTS 6,966,630 B2    11/2005    Sasaki et al. ................... 347/45
7,210,763 B2 *    5/2007    Kato et al. ..................... 347/45

FOREIGN PATENT DOCUMENTS

| EP | 1273448 A1 * | 1/2003 |
| JP | 2003-19803 | 1/2003 |
| JP | 2003-341070 | 12/2003 |
| JP | 2004-34331 | 2/2004 |
| JP | 2005-7789 | 1/2005 |

* cited by examiner

*Primary Examiner*—Juanita D Stephens
(74) *Attorney, Agent, or Firm*—McGinn IP Law Group, PLLC

(57) ABSTRACT

An inkjet head for jetting an ink from a nozzle 6 which is formed on the main body 1 of the nozzle of a metal member, wherein an $SiO_2$ film 2 comprising $SiO_2$ as the main component is formed on the surface of the nozzle main body 1 at least in the ink jetting side, and an ink repellent film 7 comprising a compound having an alkoxysilane residue attached to an end of a perfluoro polyether chain is formed on the $SiO_2$ film 2.

8 Claims, 9 Drawing Sheets

INKJET HEAD, METHOD FOR PRODUCING INKJET HEAD, INKJET RECORDER AND INKJET COATER

BACKGROUND OF THE INVENTION

1. Field of the Invention

This invention relates to an inkjet head in which an ink repellent film having a high abrasion resistance is formed on the nozzle main body, a method for producing the same, and an inkjet recorder and an inkjet coater provided with the same.

2. Description of the Related Art

There have been developed various water repellent materials aiming at preventing adhesion of dirts, imparting waterproof property and so on. Concerning these water repellent materials, studies are mainly made on silicone materials and fluorinated materials. Compared with silicone materials, fluorinated materials are seemingly favorable in order to lower surface energy. Among fluorinated materials, compounds having perfluoroalkyl chain or compounds perfluoro polyether chain are mainly studied for forming monomolecular films, while fluorinated resins are mainly studied for forming polymer films.

These water repellent materials are employed in, for example, places where water is used such as kitchen and lavatory, automobile parts such as window and car body, office equipments such as display surface and inkjet head orifice surface, and so on.

Among all, inkjet printers, which are superior in downsizing suitability to electrophotographic printers, have been widely employed not only for office uses but also for household uses. In such an inkjet printer, an ink jetted from a nozzle head to printing paper alights to the paper, thereby forming an image.

When the ink clings around the nozzle in the orifice and dries during this process, the newly jetted ink comes into contact with the dried ink, which sometimes results in a change in the jetting direction. To overcome this problem, it is a common practice to subject the head surface in the ink jetting side to an ink repellent treatment. Also, a mechanism of wiping the nozzle surface is also employed.

As an example of related art, JP-A-2003-19803 proposes to treat the surface in the ink jetting side of a head with a compound having a perfluoro polyether chain and an alkoxysilane residue. According to this proposal, the thus treated head shows a high ink repellence and a high abrasion resistance in wiping in the case of using a water base ink. However, there is still a problem that no sufficient ink repellence or a sufficient abrasion resistance in wiping can be establish in the case of using an oil base ink or a solvent base ink.

JP-A-2003-341070 discloses to coat a nozzle forming member (in particular, the nozzle made of a resin material) with a fluorine base water-repellent agent and to form an $SiO_2$ film between the nozzle forming member and the fluorine base water-repellent agent.

Although nozzle forming members made of resin materials are cited in the above example, it is desirable to use a metal material as the nozzle forming member from the viewpoint of the resistance against oil base inks and solvent base inks. Therefore, attempts are made to use a metal material as the nozzle-forming member and form an $SiO_2$ film between the nozzle forming member and an ink repellent film. In this case, however, a sufficient ink repellence and a sufficient abrasion resistance during wiping can be established in some cases but not in other cases. Namely, constant effects cannot be obtained thereby. As the results of the subsequent studies aiming at further improving the performance, it is clarified that the treatment between the nozzle-forming member made of the metal material and the $SiO_2$ film has a significant meaning.

JP-A-2004-34331 discloses a process which comprises preliminarily surface-roughening nozzle plate made of a resin or a metal having a glass transition temperature (Tg) of 100° C. or hither by the oxygen plasma treatment or a sand blasting treatment to give a surface roughness (Ra) of from 0.01 to 0.1, then forming a plasma polymer film of 0.5 µm or less on the thus roughened nozzle plate surface by the plasma CVD method with the use of a fluorine-containing compound or a silane compound as the starting material, and further applying a fluorinated resin on the film to give an ink repellent film. However, there has been known no treatment which is most suitable for forming an $SiO_2$ film on a nozzle-forming member made of a metal material.

In recent years, application of the inkjet system to various patterning devices (for example, flat panel display production devices, three-dimensional modeling devices, print circuit board forming devices, fuel battery electrode forming devices and so on) have made rapid progress by taking advantage of the characteristics thereof. In these cases, use is made of not only water base inks but also oil base inks and solvent base inks. Moreover, inks containing organic resin components are sometimes employed therefor.

These inks have low surface tension, which sometimes causes some problems such that sufficient repellence cannot occur in an ink repellent film having a low ink repellence and an ink dries, solidifies and sticks around a nozzle. As the results of the inventors' studies, it is found out that the contact angle of the nozzle part of the head should be at least 40° in the case of oil base inks or solvent base inks.

SUMMARY OF THE INVENTION

As discussed above, a surface treatment capable of imparting a sufficient ink repellence for oil base inks or solvent base inks and a sufficient abrasion resistance during wiping can be hardly performed by the related metods.

An object of the invention is to provide an inkjet head which is excellent in ink repellence and abrasion resistance and sustains a high reliability and stable ink jetting even in using over a long time, a method for producing such an inkjet head, an inkjet recorder and an inkjet coater, thereby overcoming the above-described problems occurring in the related methods.

To achieve the above object, the invention provides, (1) An inkjet head for jetting an ink comprising:

a nozzle main body formed of a metal material;

a nozzle formed on the nozzle main body;

an $SiO_2$ film containing an $SiO_2$ as a main component wherein the $SiO_2$ film is formed on at least a surface of an ink jetting side of the nozzle main body; and an ink repellent film formed from a compound having an alkoxysilane residue at an end of a perfluoro polyether chain wherein the ink repellent film is formed on the $SiO_2$ film, wherein an average surface roughness Ra of the nozzle main body is regulated to 0.13 µm or less, preferably 0.11 µm or less.

(2) The inkjet head as described in (1) above, wherein the compound having an alkoxysilane residue at an end of a perfluoro polyether chain is a compound represented by formulae:

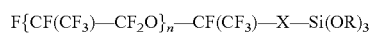

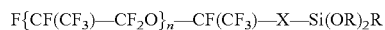

F{CF$_2$CF$_2$CF$_2$O)$_n$CF$_2$CF$_2$—X—Si(OR)$_3$

F{CF$_2$CF$_2$CF$_2$O)$_n$CF$_2$CF$_2$—X—Si(OR$_2$)R

[F{CF(CF$_3$)—CF$_2$O}$_n$CF(CF$_3$)]$_2$—Y—Si(OR)$_3$

[F{CF(CF$_3$)—CF$_2$O}$_n$CF(CF$_3$)]$_2$—Y—Si(OR)$_2$R

{F(CF$_2$CF$_2$CF$_2$O)$_n$CF$_2$CF$_2$}$_2$—Y—Si(OR)$_3$

{F(CF$_2$CF$_2$CF$_2$O)$_n$CF$_2$CF$_2$}$_2$—Y—Si(OR)$_2$R wherein X and Y each represents a binding site of an alkoxysilane residue to a perfluoro polyether chain; and R represents an alkyl group.

(3) The inkjet head as described in (2) above, wherein the alkoxysilane residue is —Si(OR)$_3$.

(4) The inkjet head as described in (2) above, wherein each of the binding sites X and Y in the formulae respectively has a molecular structure represented by formulae:

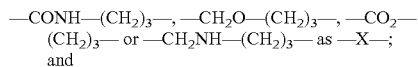

and

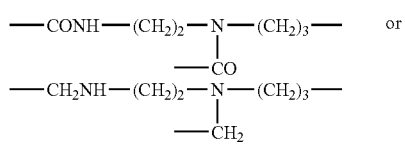

as —Y—.

(5) The inkjet head as described in (1) above, wherein the SiO$_2$ film is formed as extending in an ink channel side of the nozzle main body.

(6) The inkjet head as described in (1) above, wherein the SiO$_2$ film is formed as not extending in an ink channel side of the nozzle main body.

(7) A method for producing an inkjet head for jetting an ink from a nozzle that is formed on a nozzle main body formed of a metal material, the method comprising:

smoothening a surface of the nozzle main body;

applying a silica sol solution (for example, 0.1% by weight or less) to the nozzle main body so as to form a silica sol film, wherein the silica sol solution has a concentration that is controlled to avoid a nozzle clogging in the nozzle main body;

heating the silica sol film formed on the nozzle main body to thereby convert the silica sol film into an SiO$_2$ film;

applying an ink repellent agent solution to the SiO$_2$ film and drying to thereby form an ink repellent film, wherein the ink repellent agent solution is prepared by dissolving a compound having an alkoxysilane residue at an end of a perfluoro polyether chain in a solvent; and removing an ink repellent film formed on a side to be in contact with an ink channel of the nozzle main body while remaining at least an ink repellent film formed on a surface of an ink jetting side of the nozzle main body.

(8) A method for producing an inkjet head for jetting an ink from a nozzle that is formed on a nozzle main body formed of a metal material, the method comprising:

smoothening a surface of the nozzle main body;

forming an SiO$_2$ film on a surface of an ink jetting side of the nozzle main body, for example, sputtering; and applying an ink repellent agent solution to the SiO$_2$ film and drying to thereby form an ink repellent film, wherein the ink repellent agent solution is prepared by dissolving a compound having an alkoxysilane residue at an end of a perfluoro polyether chain in a solvent.

(9) The method for producing an inkjet heat as described in (7) or (8) above, wherein the compound having an alkoxysilane residue at an end of a perfluoro polyether chain is a compound represented by formulae:

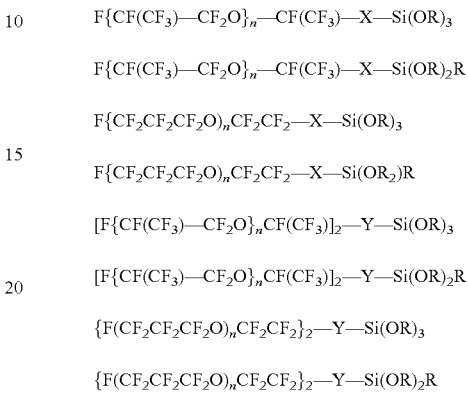

wherein X and Y each represents a binding site of an alkoxysilane residue to a perfluoro polyether chain; and R represents an alkyl group.

(10) The method for producing an inkjet head as described in (9) above, wherein the alkoxysilane residue is —Si(OR)$_3$.

(11) The method for producing an inkjet head as described in (9) above, wherein each of the binding sites X and Y in the formulae respectively has a molecular structure represented by formulae:

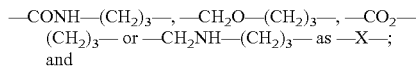

and

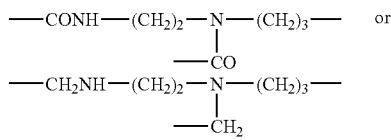

as —Y—.

(12) An inkjet recorder comprising:

an inkjet head; and a transport unit for transporting a recording substrate (for example, paper) in a definite direction, wherein an ink jetted from the inkjet head adheres to the recording substrate and thus data is recorded, and wherein the inkjet head is an inkjet head as described in any of (1) to (6) above.

(13) An inkjet coater comprising:

an inkjet head; and a transport unit for transporting a coating substrate (for example, a substrate) in a definite direction, wherein an ink jetted from the inkjet head adheres to the coating substrate, and wherein the inkjet head is an inkjet head as described in any of (1) to (6) above.

DETAILED DESCRIPTION OF THE INVENTION

Figure 13:
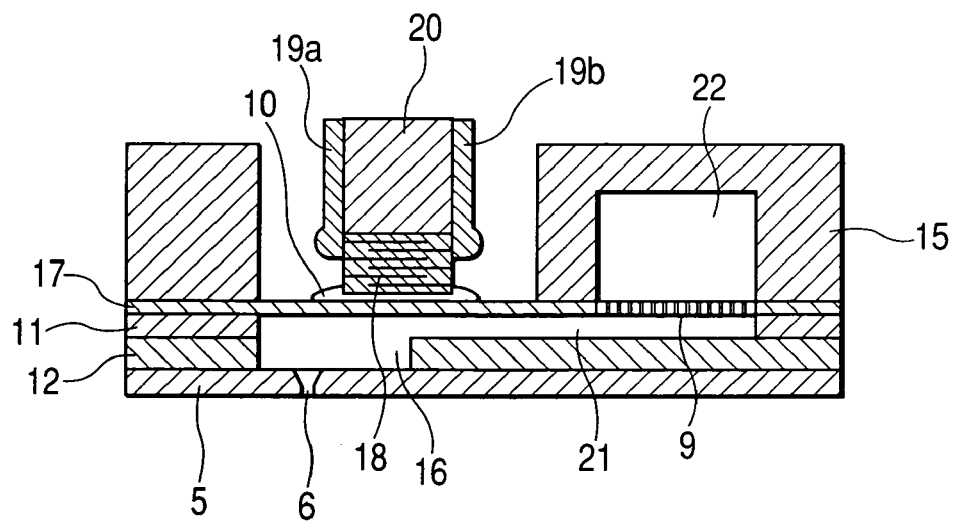
FIG. 13 presents a perspective view of an inkjet recorder having this inkjet head thereon.

Next, an embodiment of the invention will be described by referring to drawings. FIG. 13 provides a sectional view of the ink jet according to the embodiment of the invention.

In this figure, the numerical symbol 5 stands for a nozzle plate forming nozzles 6. There are a large number of nozzles 6, which are not shown in the figure, provided at definite intervals in the perpendicular direction to the paper plane. The numerical symbol 9 stands for a filter member. The numerical symbol 10 stands for an elastic adhesive such as a silicone adhesive for bonding a vibrating plate 17 to a piezoelectric element 18. The numerical symbol 11 stands for a restrictor plate forming a restrictor 21. The numerical symbol 12 stands for a pressure room plate forming a pressure room 16. The numerical symbol 15 stands for a common ink-feeding channel forming member forming a common ink-feeding channel 22. The numerical symbols 19a and 19b stand for signal input terminals. The numerical symbol 20 stands for a piezoelectric element-fixing plate. The numerical symbol 21 stands for a restrictor for connecting the common ink-feeding channel 22 to the pressure room 16 and regulating the ink flow into the pressure room 16.

The restrictor plate 11, the pressure room plate 12, and the like are made by, for example, etching or fine pressing a stainless material. In the nozzle plate 5, a large number of nozzles 6 are formed by fine pressing a stainless material. The piezoelectric element-fixing plate 20 is made of an electrically insulating material such as ceramics or polyimide. By bonding the nozzle plate 5 and the pressure room plate 12 with an adhesive, the pressure room 16 (an ink channel) is formed as a compartment.

An ink flows in the common ink-feeding channel 22 from the upstream toward the downstream and passes through the filter member 9 in the course of the common ink-feeding channel 22. Thus, it flows into the restrictor 21, the pressure room 16 and the nozzles 6 in this order. The piezoelectric element is stretched upon the loading of voltage between the signal input terminals 19a and 19b. When the voltage is unloaded, the piezoelectric element returns into the non-stretched form. Due to the deformation of this piezoelectric element 18, pressure is applied to the ink in the pressure room 16 and thus ink droplets are jetted from the nozzles 6.

The nozzle plate 5 in the inkjet head having the above constitution is constructed in EXAMPLES as will be described hereinafter. When an oil base ink containing a pigment is filled into the inkjet head obtained by this EXAMPLE and then jetted, it is confirmed that stable jetting can be carried out over prolonged use without spreading of the ink on the surface of the nozzle plate 5. Moreover, the surface of the nozzle plate 5 is repeatedly wiped so as to remove the ink sticking to the surface. As a result, it is also confirmed that favorable wiping properties are sustained over a long time.

In the inkjet head according to the invention, the nozzle surface is smoothened and then an $SiO_2$ film is formed thereon. Next, an ink repellent film comprising a compound having an alkoxysilane residue attached to an end of a perfluoro polyether chain is formed on the $SiO_2$ film.

The processing accuracy of the nozzle plate largely affects the ink jetting properties of the inkjet head. Since scattering in nozzle accuracy (size of hole diameter of nozzle) should be minimized among a large number of nozzles, the nozzle plate should be produced at a high processing accuracy. Thus, it is preferable that the nozzle plate is made of a metal material which is suitable for the fine press processing method, the laser processing method, the etching processing method, electroforming, etc.

In the case of using a water base ink, however, atmospheric moisture is liable to be dissolved in the ink compared with an oil base ink, which might cause nozzle corrosion. Therefore, it is desirable to employ a stainless steel plate as the material for the nozzle plate from the viewpoint of rust proofness.

More specifically speaking, use can be made of Austin materials such as SUS201, SUS202, SUS301, SUS302, SUS303, SUS303Se, SUS304, SUS304L, SUS304N1, SUS304N2, SUS304LN, SUS305, SUS309S, SUS310S, SUS316, SUS316L, SUS316N, SUS316LN, SUS316J1, SUS316J1L, SUS317, SUS317L, SUS317J1, SUS321, SUS347, SUSXM7, SUSMX15J1 and SUS329J1;

ferrite materials such as SUS405, SUS410L, SUS430, SUS430F, SUS434, SUS447J1 and SUSXM27;

martensite materials such as SUS403, SUS410, SUS410J1, SUS416, SUS420J1, SUS420F, SUS431, SUS440A, SUS440B, SUS440C and SUS440F; and participation hardening materials such as SUS630 and SUS631.

In the case of using an ink containing a rust proofing agent or an ink having no corrosive properties, use may be made of an iron/nickel alloy. In the case where the ink channel in the inkjet head is made of a silicon wafer and the ink channel is bonded to the nozzle plate with a heat-hardening adhesive, it is preferable to employ an iron/nickel alloy having a ratio (iron:nickel) of from 50 to 65:50 to 35 which has a linear expansion coefficient similar to that of the silicon wafer. In the case of forming the nozzle plate by electroforming, use maybe preferably made of nickel, palladium or an alloy thereof.

It is important in the invention to smoothen the nozzle surface. As the nozzle plate, it is a common practice to employ a thin plate of about 30 to 150 μm in thickness made of a rolled material which usually has a surface roughness of about Ra≧0.14 μm. Since the desired performance cannot be ensured at such a surface roughness, it is required to positively smoothen the surface to attain an average surface roughness Ra of 0.13 μm or less, ideally 0 μm. Examples of the smoothening method include grinding with a paper grinder, a polishing tape or a polishing slurry.

After smoothening the surface, an $SiO_2$ film is formed. For the film formation, it is preferable to employ, for example, sputtering, vacuum deposition, a CVD method or a method which comprises applying a silica sol (i.e., an $SiO_2$ precursor) to the nozzle plate by spray coating, spin coating, dip coating or the like and then heating to give the $SiO_2$ film.

Silica sol is a polymer having from several ten to several hundred alkoxysilane units and its average molecular weight is several to several ten thousands. This silica sol is soluble in alcohols such as methanol, ethanol, propanol and isopropanol. To convert into the $SiO_2$ film, the silica sol should be heated to 80° C. or higher. It is desirable to heat it to about 180° C. since the film strength can be further enhanced thereby.

It is also desirable that the film thickness ranges from about several ten to several hundreds nm. When the film thickness is too small (for example, several nm), it is feared that pinholes may occur or the strength may become insufficient. When the film thickness is too large, on the other hand, there arise some problems such that no effect can be established by smoothening the nozzle surface and the nozzle size is reduced by the $SiO_2$ film thickness and, therefore, the nozzle size reduction should be taken into consideration upon designing.

As the ink repellent agent to be used for forming the ink repellent film according to the invention, use may be appropriately made of a compound having a perfluoro polyether chain and an alkoxysilane residue in a molecule. This is because, by using such an ink repellent agent, the binding properties of the ink repellent film to the $SiO_2$ film located under it can be enhanced and the migration of the ink repellent agent can be prevented by the binding to the ink repellent agent. As a result, the ink repellent film can be formed at a high positional accuracy.

Examples of the ink repellent agent preferably usable in the invention are those represented by the following general formulae.

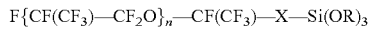

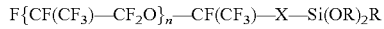

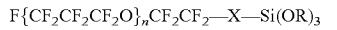

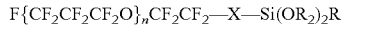

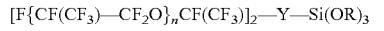

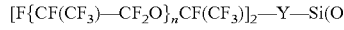

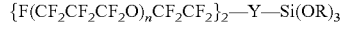

wherein X and Y each represents the binding site of an alkoxysilane residue to a perfluoro polyether chain; and each R represents an alkyl group.

Concerning the ends in the above general formulae, —Si(OR)$_3$ is superior to —Si(OR)$_2$ from the viewpoint of the abrasion resistance of the ink repellent film. This is seemingly because a compound having the —Si(OR)$_3$ end has three binding sites to the nozzle plate (nozzle main body) per molecule, while a compound having the —Si(OR)$_2$ end has only two binding sites.

Although the binding sites X and Y in the above general formulae, are not particularly restricted, it is preferable to employ molecular structures which are not hydrolyzed even in the case of using an ink having a somewhat basic nature. More specifically speaking, it is desirable to employ molecular structures having an amide bond, an ether bond, etc. or molecular structures free from an ester bond or an ionic bond. Particular examples of molecular structures preferably usable in the invention are as follows.

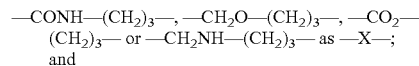

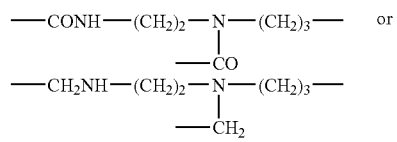

as —Y—.

Next, methods of synthesizing ink repellent agents (compounds 1 to 8) usable in the invention will be illustrated.

Synthesis of Compound 1

25 parts by weight of Krytox 157FS-L (manufactured by DuPont, average molecular weight 2500) was dissolved in 100 parts by weight of PF-5080 (manufactured by 3M). Then 20 parts by weight of thionyl chloride was added thereto and the resultant mixture was refluxed for 48 hours under stirring. Next, the thionyl chloride and PF-5080 were evaporated on an evaporator to give 25 parts by weight of an acid chloride Krytox 157FS-L.

Next, 100 parts by weight of PF-5080, 3 parts by weight of Sila-Ace S330 (manufactured by Chisso Co.) and 3 parts by weight of triethylamine were added thereto and the obtained mixture was stirred at room temperature for 20 hours. The liquid reaction mixture was filtered through Radiolite Fine Flow A (manufactured by Showa Chemical Industries, Co., Ltd.) and PF-5080 in the filtrate was evaporated on an evaporator to give 20 parts by weight of the following compound 1.

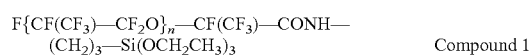 Compound 1

Synthesis of Compound 2

20 parts by weight of the following compound 2 was obtained as in the, synthesis of the compound 1 but using 3 parts by weight of Sila-Ace S360 (manufactured by Chisso Co.) as a substitute for 3 parts by weight of Sila-Ace S330 (manufactured by Chisso Co.).

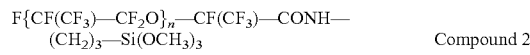 Compound 2

Synthesis of Compound 3

30 parts by weight of the following compound 3 was obtained as in the synthesis of the compound 1 but using 35 parts by weight of DEMNAM SH (manufactured by Daikin Industries, Ltd., average molecular weight 3500) as a substitute for 25 parts by weight of Krytox 157FS-L (manufactured by DuPont, average molecular weight 2500).

Compound 3

Synthesis of Ccompound 4

30 parts by weight of the following compound 4 was obtained as in the synthesis of the compound 1 but using 3 parts by weight of Sila-Ace S360 (manufactured by Chisso Co.) as a substitute for 3 parts by weight of Sila-Ace S330 (manufactured by Chisso Co.) and 35 parts by weight of DEMNAM SH (manufactured by Daikin Industries; Ltd., average molecular weight 3500) as a substitute for 25 parts by weight of Krytox 157FS-L (manufactured by DuPont, average molecular weight 2500).

$F\{CF_2CF_2CF_2O\}_nCF_2CF_2\text{—}CONH\text{—}(CH_2)_3\text{—}Si(OCH_3)_3$ Compound 4

Synthesis of Compound 5

20 parts by weight of the following compound 5 was obtained as in the synthesis of the compound 1 but using 1 part by weight of Sila-Ace S320 (manufactured by Chisso Co.) as a substitute for 3 parts byweight of Sila-Ace S330 (manufactured by Chisso Co.).

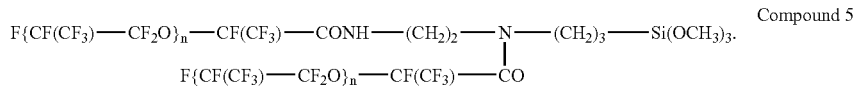
Compound 5

Synthesis of Compound 6

20 parts by weight of the following compound 6 was obtained as in the synthesis of the compound 5 but using 1 part by weight of Sila-Ace S310 (manufactured by Chisso Co.) as a substitute for 1 part by weight of Sila-Ace S320 (manufactured by Chisso Co.).

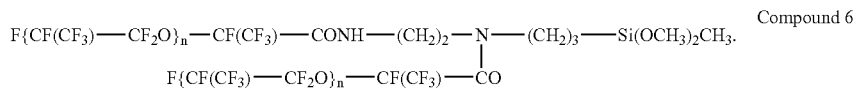
Compound 6

Synthesis of Compound 7

30 parts by weight of the following compound 7 was obtained as in the synthesis of the compound 5 but using 35 parts by weight of DEMNAM SH (manufactured by Daikin Industries, Ltd., average molecular weight 3500) as a substitute for 25 parts by weight of Krytox 157FS-L (manufactured by DuPont, average molecular weight 2500).

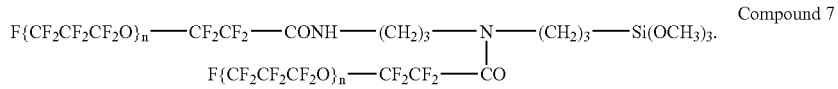
Compound 7

Synthesis of Compound 8

30 parts by weight of the following compound 8 was obtained as in the synthesis of the compound 5 but using 3 parts by weight of Sila-Ace S310 (manufactured by Chisso Co.) as a substitute for 3 parts by weight of Sila-Ace S320 (manufactured by Chisso Co.) and 35 parts by weight of DEMNAM SH (manufactured by Daikin Industries, Ltd., average molecular weight 3500) as a substitute for 25 parts by weight of Krytox 157FS-L (manufactured by DuPont, average molecular weight 2500).

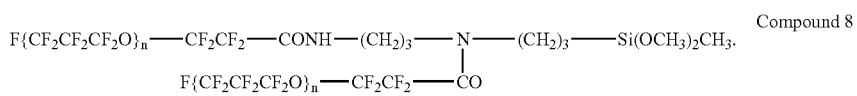
Compound 8

The average molecular weight of the ink repellent agent roughly ranges from about 1000 to about 12000, though it varies depending the perfluoro polyether chain size and the number of the perfluoro polyether chains per molecule. The ink repellent film thus formed is a layer at the molecular level which has a film thickness of several nm. The film thickness can be determined by measuring with a film thickness meter of the non-contact type (Ellipsometer manufactured by Mizoriji Optical Co.) or examining the CF stretching vibration at around 1200 Kaiser in the IR spectrum of reflection-mode.

As the results of our experiment, it is found out that surface having been treated with these ink repellent agents repels not only water base inks highly soluble in water but also oil base inks hardly soluble or insoluble in water.

To form the ink repellent film, a solution is prepared by dissolving the ink repellent agent in a solvent. Then this solution is applied to the nozzle plate by brush coating, spray coating, spin coating, dip coating or the like. Next, it is heated so that the alkoxysilane residue in the ink repellent agent reacts with hydroxyl group on the $SiO_2$ film surface and thus the ink repellent agent chemically binds to the $SiO_2$ film surface, thereby forming the ink repellent film.

When being in contact with moisture, the ink repellent agent to be used in the invention is hydrolyzed. It is also required that the ink repellent agent can enter a nozzle of about 10 to 50 μm in diameter. It is, therefore, preferable that the solvent to be used in preparing the coating solution is a fluorinated solvent having a low moisture content and a low surface tension. Specific examples thereof include FC-72, FC-77, PF-5060, PF-5080, HFE-7100, HFE-7200 (each manufactured by 3M), Vertrel XF (manufactured by DuPont) and so on.

Figure 1:
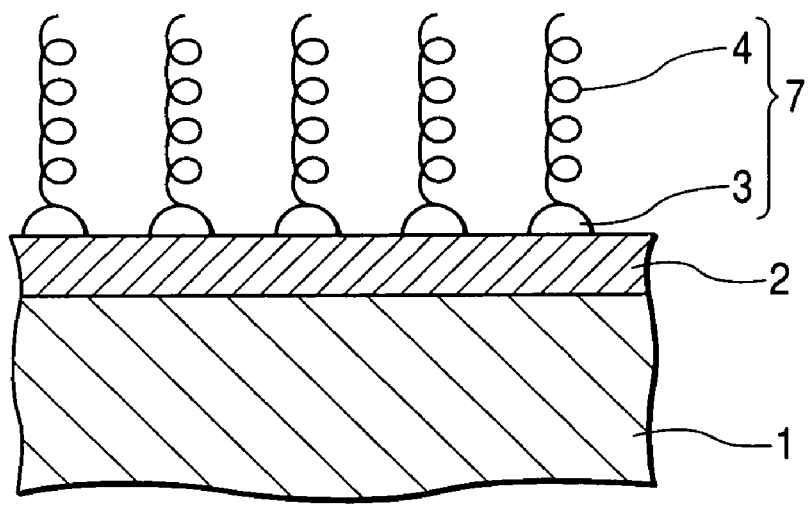
FIG. 1 presents a schematic view showing the state of forming an ink repellent film via an $SiO_2$ film on the nozzle main body according to the invention.
Figure 2:
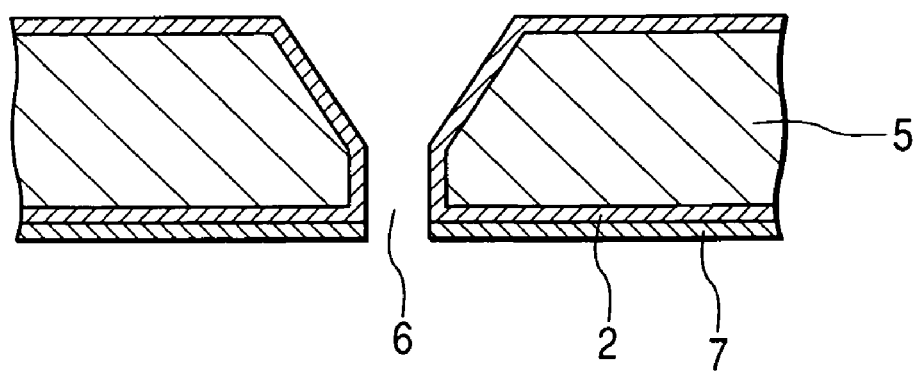
FIG. 2 presents a partly sectional view of the nozzle main body of EXAMPLE 1 according to the invention.

FIG. 1 is a schematic view showing the sate where an ink repellent film is formed on the surface of the nozzle main body. As FIG. 1 shows, an $SiO_2$ film 2 is formed on the surface of the nozzle main body 1 and an ink repellent film 7 is formed on the surface of the $SiO_2$ film 2. As schematically shown in the figure, this ink repellent film 7 has binding sites 3, at which it chemically binds to the $SiO_2$ film via the reaction with hydroxyl groups on the $SiO_2$ film, and parts 4 having the perfluoro polyether chain.

Next, specific embodiments will be illustrated.

EXAMPLE 1

Figure 3A:
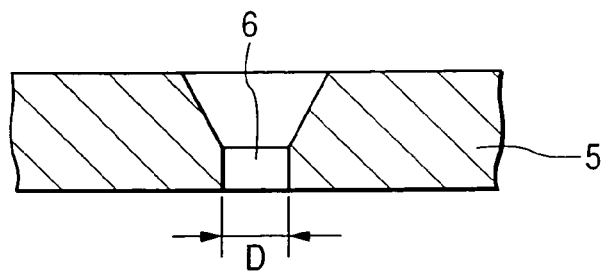
FIG. 3A to 3E present a drawing for illustrating the process of forming an $SiO_2$ film and an ink repellent film on the nozzle main body.

EXAMPLE 1 of the invention will be illustrated in greater detail by referring to FIGS. 2 and 3A to 3E. As FIG. 3A shows, a nozzle plate 5 was constructed by providing a large number of nozzles 6 (nozzle diameter D:50 μm) by fine pressing on an SUS304 plate (10 mm in width, 100 mm in length, 0.08 mm in thickness). The surface of the nozzle plate 5 was polished with a polishing tape. After the completion of the polishing, the nozzle surface roughness Ra≦0.11 μm.

This nozzle plate 5 was dipped in a silica sol solution diluted with ethanol so that the nozzle plate 5 was entirely coated with the silica sol. The concentration of the solution should be controlled so as to not cause clogging in the nozzle 6 (nozzle diameter D: 50 μm) by the silica sol. In this EXAMPLE, the silica sol concentration was controlled to not more than 0.1% by weight.

Figure 3B:
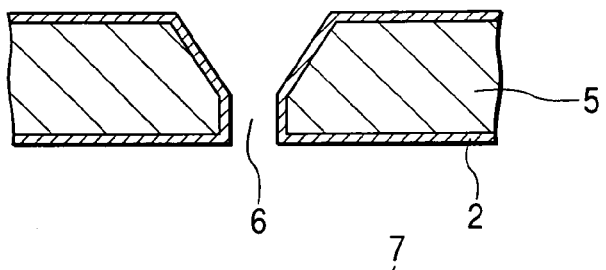

Subsequently, the nozzle plate 5 was heated to 180° C. for 30 minutes to thereby convert the silica sol film into an $SiO_2$ film 2 as shown in FIG. 3B. The $SiO_2$ film 2, which was formed on the overall face of the nozzle plate 5, had a thickness of about several tens nm. After cooling to room temperature, the nozzle plate 5 was dipped in a solution prepared by diluting a solution of an ink repellent agent DEMNAM DSX (OPTOOL DSX, manufactured by Daikin Industries, Ltd.) with HFE-7200 (manufactured by 3M) to 0.1% by weight for 10 minutes and then heated to 120° C. for 20 minutes.

DEMNAM DSX as described above has the following structural formula.

$F(CF_2CF_2CF_2O)\text{-}nCF_2CF_2\text{—}O\text{—}Si\text{—}(OR)_3$

Figure 3C:
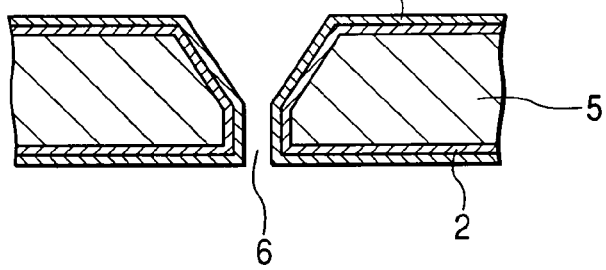

The ink repellent film 7 thus obtained had a thickness of from 6 to 10 nm. As FIG. 3C shows, the ink repellent film 7 was formed on the overall face of the nozzle plate 5 at this point. Upon contact with an ink, therefore, the ink repellent film in the ink channel side should be removed.

Figure 3D:
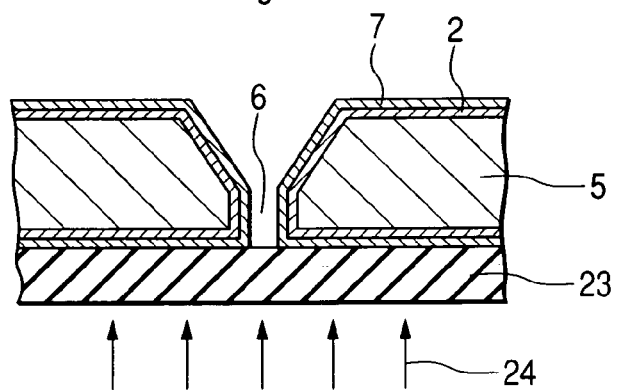
Figure 3E:
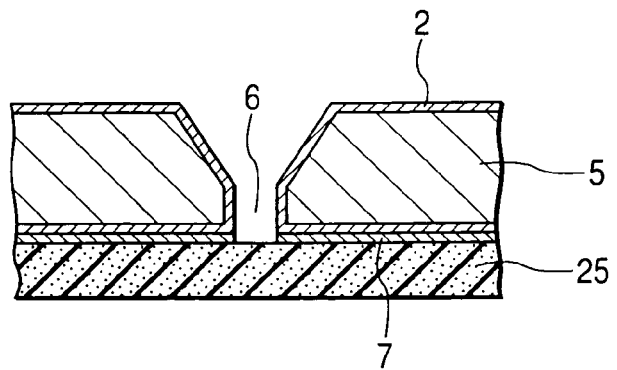

Accordingly, a dry film resist 23 made of Dry Film Resist FX130 (manufactured by DuPont) was laminated by using a laminator model MAII-700 (manufactured by Taisei Laminator) on the surface in the ink jetting side from the nozzle plate 5 as shown in FIG. 3D. Then the dry film resist 23 was irradiated with UV light 24 from an exposure device to form a mask 25 as shown in FIG. 3E.

Next, plasma irradiation was performed by using a plasma ashing system (manufactured by Yamato Glass Co.). Thus, the ink repellent film 7 in the ink channel side was removed and then the mask 25 was removed too. Thus, a nozzle plate 5 having the ink repellent film 7 formed exclusively on the surface in the ink jetting side was obtained (see FIG. 2).

EXAMPLE 2

The surface of a nozzle plate, which was constructed by providing a large number of nozzles (nozzle diameter D:50 μm) by fine pressing on an Fe-42Ni plate (10 mm in width, 100 mm in length, 0.08 mm in thickness), was polished with a polishing tape. After the completion of the polishing, the nozzle surface roughness Ra≦0.07 μm.

Subsequently, an $SiO_2$ film and an ink repellent film were formed as in EXAMPLE 1 to thereby give a nozzle plate having the ink repellent film on the surface in the ink jetting side.

EXAMPLE 3

The surface of a nozzle plate, which was constructed by providing a large number of nozzles (nozzle diameter D:50 μm) by electroforming on a nickel plate (10 mm in width, 100 mm in length, 0.08 mm in thickness), was polished with a polishing tape. After the completion of the polishing, the nozzle surface roughness Ra≦0.13 μm.

Subsequently, an $SiO_2$ film and an ink repellent film were formed as in EXAMPLE 1 to thereby give a nozzle plate having the ink repellent film on the surface in the ink jetting side.

EXAMPLE 4

Figure 4:
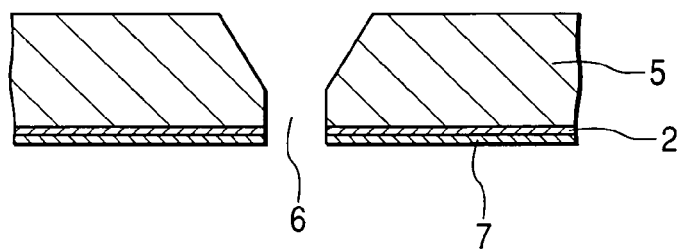
FIG. 4 presents a partly sectional view of the nozzle main body of EXAMPLE 4 according to the invention.

Now, EXAMPLE 4 of the invention will be illustrated by referring to FIG. 4. A nozzle plate 5 was constructed by providing a large number of nozzles 6 (nozzle diameter D:50 μm) by fine pressing on an SUS304 plate (10 mm in width, 100 mm in length, 0.08 mm in thickness). The surface of the nozzle plate 5 was polished with a polishing tape. After the completion of the polishing, the nozzle surface roughness Ra≦0.11 μm.

Then $SiO_2$ was sputtered on the surface in the ink jetting side of this nozzle plate 5 with the use of an RF Sputtering Device (manufactured by ULVAC Inc.) to thereby form an $SiO_2$ film 2 of several tens nm in thickness.

Subsequently, an ink repellent film 7 was formed on the $SiO_2$ film 2 as in EXAMPLE 1 to thereby give a nozzle plate 5.

EXAMPLE 5

The surface of a nozzle plate, which was constructed by providing a large number of nozzles (nozzle diameter D:50 μm) by fine pressing on an Fe-42Ni plate (10 mm in width, 100 mm in length, 0.08 mm in thickness), was polished with a polishing tape. After the completion of the polishing, the nozzle surface roughness Ra≦0.07 μm.

Subsequently, an $SiO_2$ film and an ink repellent film were formed as in EXAMPLE 4 to thereby give a nozzle plate 5 having the ink repellent film on the surface in the ink jetting side.

EXAMPLE 6

The surface of a nozzle plate, which was constructed by providing a large number of nozzles (nozzle diameter D:50 μm) by electroforming on a nickel plate (10 mm in width, 100 mm in length, 0.08 mm in thickness), was polished with a polishing tape. After the completion of the polishing, the nozzles surface roughness Ra≦0.13 μm.

Subsequently, an SiO$_2$ film and an ink repellent film were formed as in EXAMPLE 4 to thereby give a nozzle plate having the ink repellent film on the surface in the ink jetting side.

EXAMPLE 7

As a substitute for the ink repellent agent employed in EXAMPLE 4, use was made of a solution prepared by diluting a solution of the above-described compound 1 with a solution of Fluorinert-5080 (manufactured by 3M) to a concentration of 0.3% by weight. A nozzle plate having an SiO$_2$ film was dipped in this solution for 10 minutes and then heated to 120° C. for 20 minutes. The ink repellent film thus obtained had a thickness of from 4 to 7 nm.

Subsequently, the procedure of EXAMPLE 4 was followed to thereby give a nozzle plate having an ink repellent film on the surface in the ink jetting side.

EXAMPLE 8

A nozzle plate having an ink repellent film of 6 to 10 μm in thickness formed on the surface in the ink jetting side was obtained as in EXAMPLE 7 but using the compound 2 as a substitute for the compound 1.

EXAMPLE 9

A nozzle plate having an ink repellent film of 6 to 10 μm in thickness formed on the surface in the ink jetting side was obtained as in EXAMPLE 7 but using the compound 3 as a substitute for the compound 1.

Although EXAMPLES of nine types have been illustrated above, the combination of a nozzle plate material, a method for forming the SiO$_2$ film and a compound having a perfluoro polyether chain and an alkoxysilane residue is not restricted thereto. Similarly, a dry film resist, a laminator and a plasma ashing device to be used in removing an ink repellent film are not restricted to those cited above.

COMPARATIVE EXAMPLE 1

A nozzle plate was constructed by providing a large number of nozzles 6 (nozzle diameter D:50 μm) by fine pressing on an SUS304 plate (10 mm in width, 100 mm in length, 0.08 mm in thickness). The nozzle surface roughness Ra≧0.14 μm.

The nozzle plate was dipped in a solution prepared by diluting a solution of an ink repellent agent DEMNAM DSX (manufactured by Daikin Industries, Ltd.) with HFE-7200 (manufactured by 3M) to 0.1% by weight for 10 minutes and then heated to 120° C. for 20 minutes.

The ink repellent film thus obtained had a thickness of from 6 to 10 nm. The ink repellent film was formed on the overall face of the nozzle plate at this point. Upon contact with an ink, therefore, the ink repellent film in the ink channel side should be removed.

Accordingly, a dry film resist made of Dry Film Resist FX130 (manufactured by DuPont) was laminated by using a laminator model MAII-700 (manufactured by Taisei Laminator) on the surface in the ink jetting side from the nozzle plate. Then the dry film resist was irradiated with UW light from an exposure device to form a mask. Next, plasma irradiation was performed by using a plasma ashing system (manufactured by Yamato Glass Co.). Thus, the ink repellent film in the ink channel side was removed to give a nozzle plate.

COMPARATIVE EXAMPLE 2

A nozzle plate was obtained as in COMPARATIVE EXAMPLE 1 but polishing the nozzle surface with a polishing tape to give a surface roughness Ra≦0.11 μm. COMPARATIVE EXAMPLE 3

A nozzle plate was constructed by providing a large number of nozzles 6 (nozzle diameter D:50 μm) by fine pressing on an SUS304 plate (10 mm in width, 100 mm in length, 0.08 mm in thickness). The surface roughness Ra≧0.14 μm.

This nozzle plate was dipped in a silica sol solution diluted with ethanol to a concentration of 0.1% or less so that the nozzle plate was coated with the silica sol. Then the nozzle plate was heated to 180° C. for 30 minutes to thereby convert the silica sol film into an SiO$_2$ film 2. The thickness of the SiO$_2$ film was about several tens nm. Subsequently, an ink repellent film was formed as in COMPARATIVE EXAMPLE 1 to give a nozzle plate.

The ink repellent films of the nozzle plates constructed in the above EXAMPLES 1 to 9 and COMPARATIVE EXAMPLES 1 to 3 were evaluated. The evaluation was made by impregnating a nonwoven fabric with an oil base ink containing a pigment, then sliding the nonwoven fabric on the ink repellent film of a nozzle plate and then measuring the contact angle of the oil base ink to the ink repellent film face after the sliding.

More specifically speaking, a sliding test was carried out by coating the outer periphery of a metal bar (diameter: 7 mm) with a silicone rubber having a thickness of 2 mm and a Shore hardness of 55, further winding a non-woven fabric impregnated with an oil base ink containing a pigment around the bar, and sliding it at a speed of 50 mm/sec and a sliding distance of 20 mm. The number of slidings needed until the contact angle was maintained at 40° or above was examined. The results are given in the following table.

TABLE 1

| Nozzle plate | | Ra | SiO$_2$ | Ink repellent agent | Number of sliding |
|---|---|---|---|---|---|
| Example 1 | SUS | ≦0.11 μm | Yes | DEMNAM DSX | 210 |
| Example 2 | Fe—Ni | ≦0.07 μm | Yes | DEMNAM DSX | 180 |
| Example 3 | Ni | ≦0.13 μm | Yes | DEMNAM DSX | 180 |
| Example 4 | SUS | ≦0.11 μm | Yes | DEMNAM DSX | 220 |
| Example 5 | Fe—Ni | ≦0.07 μm | Yes | DEMNAM DSX | 190 |
| Example 6 | Ni | ≦0.13 μm | Yes | DEMNAM DSX | 190 |
| Example 7 | SUS | ≦0.11 μm | Yes | compound 1 | 160 |
| Example 8 | SUS | ≦0.11 μm | Yes | compound 2 | 210 |
| Example 9 | SUS | ≦0.11 μm | Yes | compound 3 | 240 |
| Comparative Example 1 | SUS | ≧0.14 μm | No | DEMNAM DSX | ≦10 |
| Comparative Example 2 | SUS | ≦0.11 μm | No | DEMNAM DSX | ≦10 |
| Comparative Example 3 | SUS | ≧0.14 μm | Yes | DEMNAM DSX | ≦10 |

As the results of the sliding test clearly indicate, the ink repellent films of COMPARATIVE EXAMPLE 1 (the plate surface being rough with the average surface roughness of 0.14 μm or more and the ink repellent film being formed directly on the nozzle plate surface), COMPARATIVE EXAMPLE 2 (the average surface roughness of the nozzle plate being small, i.e., 0.11 μm or less but the ink repellent film being formed directly on the nozzle plate surface) and COMPARATIVE EXAMPLE 3 (the ink repellent film being formed on the nozzle plate via the $SiO_2$ film but the plate surface being rough with the average surface roughness of 0.14 μm or more) showed each a small number of slidings (10 or less) needed until the contact angle was maintained at 40° or above, even by using similar ink repellent agents as in EXAMPLES. That is, the ink repellent films of COMPARATIVE EXAMPLES 1 to 3 are insufficient in abrasion resistance.

In each of the nozzle plates of EXAMPLES 1 to 9 according to the invention, in contrast thereto, the average surface roughness was regulated to 0.13 μm or less and the $SiO_2$ film was formed on the nozzle plate surface and then an ink repellent film comprising a compound having an alkoxysilane residue attached to an end of a perfluoro polyether chain was formed on the $SiO_2$ film.

Due to the synergistic effects thus achieved, the number of slidings could be elevated about 20-fold in COMPARATIVE EXAMPLES. Thus, it has been proved that these nozzle plates are excellent in abrasion resistance.

EXAMPLE 10

Figure 5:
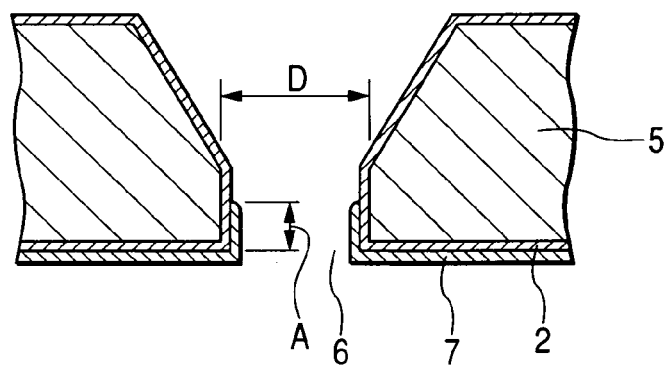
FIG. 5 presents a partly sectional view of the nozzle main body of EXAMPLE 10 according to the invention.
Figure 6:
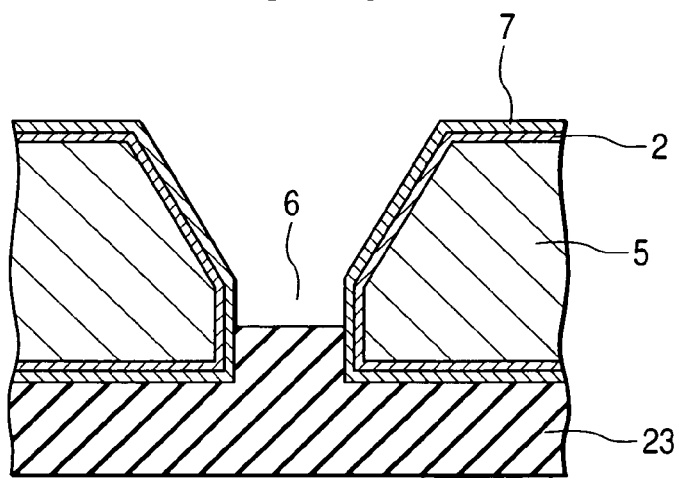
FIG. 6 presents a drawing for illustrating the process of forming an $SiO_2$ film and an ink repellent film on the nozzle main body.

Next, EXAMPLE 10 of the invention will be illustrated by referring to FIGS. 5 and 6. As FIG. 6 shows, an ink repellent film 7 was formed via an $SiO_2$ film on the overall face of the nozzle plate 5 in the same manner as in EXAMPLE 1.

Next, a dry film resist 23 made of Dry Film Resist FX130 (manufactured by DuPont) was laminated by using a laminator model MAII-700 (manufactured by Taisei Laminator) on the surface in the ink jetting side from the nozzle plate 5. After the completion of the lamination, the nozzle plate 5 was passed again through the laminator at a roller temperature of 120° C., a roller speed of 30 mm/s under a roller pressure of 0.4 MPa.

Thus, a part of the dry film resist 23 entered the nozzle 6, as shown in FIG. 6. The amount of the dry film resist entering the nozzle can be arbitrarily controlled by changing the laminator conditions as defined above or the number of passing through the laminator. In this EXAMPLE, the entering amount corresponding to ¼ of the nozzle diameter D was referred to as A (see FIG. 5).

Then the nozzle plate 5, which was coated with the ink repellent film 7 on the ink jetting face and in which the ink repellent film 7 entered the nozzle to ¼ of the nozzle diameter from the surface, was irradiated with UV light from an exposure device to form a mask.

Next, plasma irradiation was performed by using a plasma ashing system (manufactured by Yamato Glass Co.). Thus, the ink repellent film 7 in the ink channel side was removed.

As a result, a nozzle plate 5 in which the ink repellent film 7 entered the nozzle to ¼ of the nozzle diameter from the surface of the nozzle plate 5 was obtained.

In this EXAMPLE, SUS304 was employed as the nozzle plate material, the $SiO_2$ film was formed by applying silica sol and then heating, and OPTOOL DSX was employed in forming the ink repellent film. However, the combination of a nozzle plate material, a method for forming the $SiO_2$ film and a compound having a perfluoro polyether chain and an alkoxysilane group is not restricted thereto.

Similarly, a dry film resist, a laminator and a plasma ashing device to be used in removing an ink repellent film are not restricted to those cited above. Although the amount of the ink repellent film entering the nozzle corresponded to ¼ of the nozzle diameter, there arises no problem in the case where the entering amount corresponds to ¼ or less. When the entering amount exceeds ¼, however, there is a risk that ink meniscus is formed at a deep position from the nozzle surface and thus ink jetting becomes difficult.

EXAMPLE 11

Figure 7:
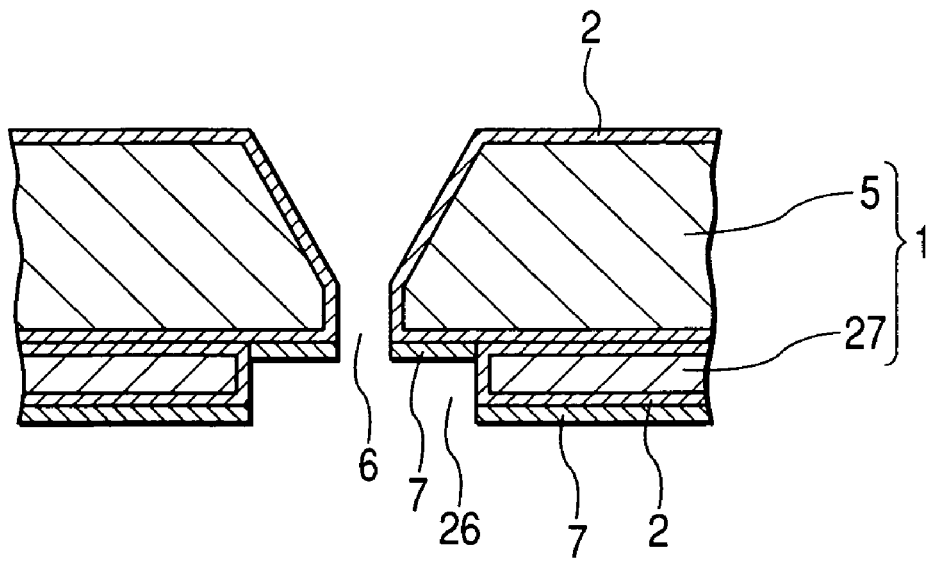
FIG. 7 presents a partly sectional view of the nozzle main body of EXAMPLE 11 according to the invention.
Figure 8:
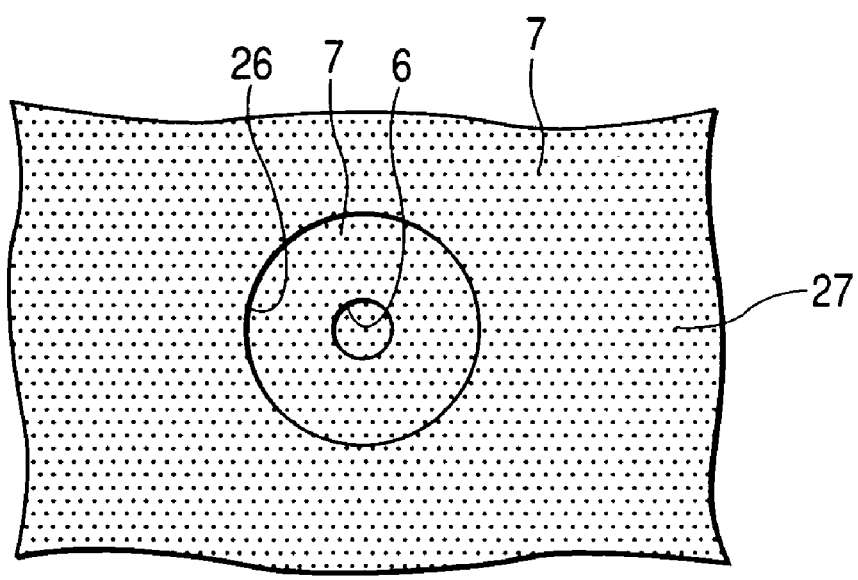
FIG. 8 presents a view of this nozzle main body observed from the ink jetting surface side.

Next, EXAMPLE 11 of the invention will be illustrated by referring to FIGS. 7 to 9. In this EXAMPLE, a cover plate 27 having a hole 26 larger than the nozzle of the nozzle plate 5 was provided on the surface of the nozzle plate 5 in the ink jetting side. More specifically speaking, use was made of a cover plate 27 constructed by etching of an SUS304 plate (10 mm in width, 100 mm in length, 0.03 mm in thickness) to give holes 26 (diameter 250 μm) located at positions corresponding to respective nozzles 6 of the nozzle plate 5.

In the above EXAMPLES 1 to 10, the nozzle main body 1 is composed of the nozzle plate 5 alone. In contrast, the nozzle main body 1 is composed of the nozzle plate 5 combined with the cover plate 27 in this EXAMPLE.

Figure 9A:
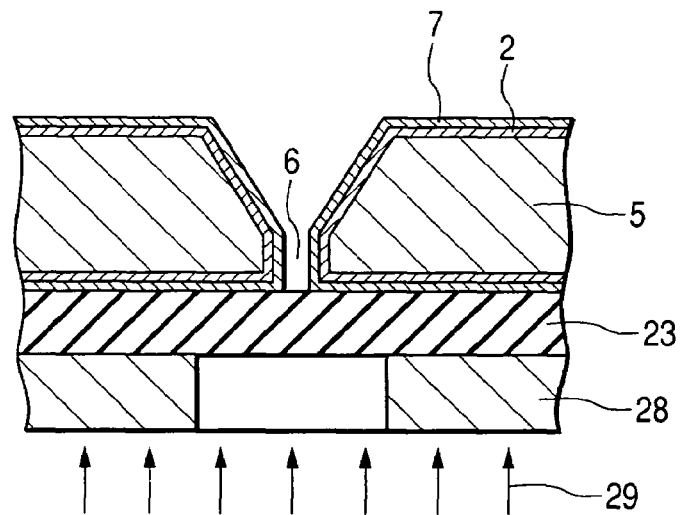
FIG. 9A to 9C present a drawing for illustrating the process of forming an $SiO_2$ film and an ink repellent film on the nozzle main body.
Figure 9B:
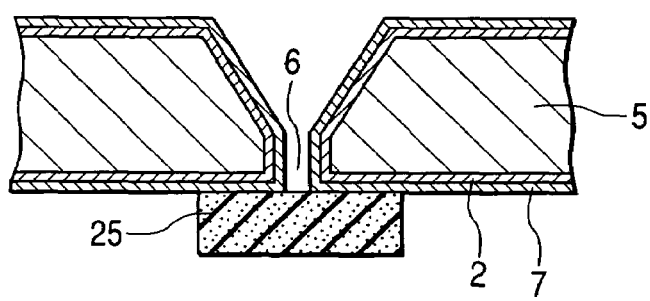
Figure 9C:
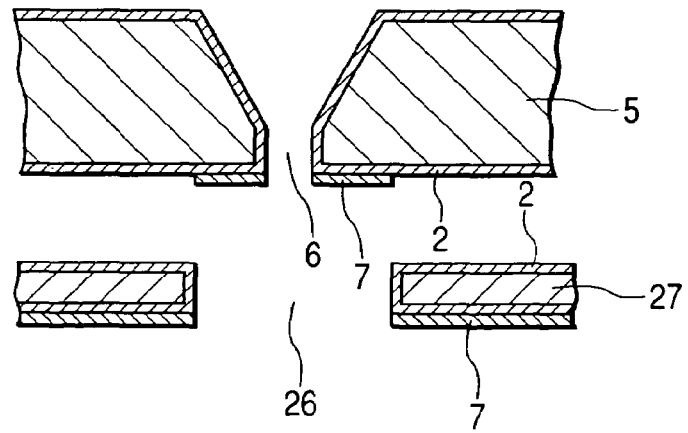

FIGS. 9A to 9C are drawings for illustrating the production process of the nozzle main body 1 according to this EXAMPLE. As FIG. 9A shows, an ink repellent film 7 was formed on the overall face of the nozzle plate 5 via an $SiO_2$ film 2 by the same procedure as in any of EXAMPLES 1 to 10.

Next, a dry film resist 23 made of Dry Film Resist FX130 (manufactured by DuPont) was laminated by using a laminator model MAII-700 (manufactured by Taisei Laminator) on the surface in the ink jetting side of the nozzle plate 5. Then, the nozzle plate was coated with a cover 28 except the part to be bonded to the cover plate 27 (i.e., remaining the resist 23 on the ink repellent film 7 in the vicinity of nozzles) and then exposed to light [see FIG. 9A].

Next, it was developed and a mask 25 was formed in the part to be bonded to the cover plate 27 [see FIG. 9B] and plasma irradiation was performed by using a plasma ashing system (manufactured by Yamato Glass Co.). Thus, the unnecessary ink repellent film 7 on the nozzle plate 5 was removed and then the mask 25 was taken off from the nozzle plate.

On the other hand, the surface of the cover plate 27 was polished with a polishing tape to give a surface roughness $Ra \leq 0.11$ μm. This cover plate 27 was dipped in a silica sol solution diluted with methanol to thereby coat the cover plate 27 with the silica sol. The concentration of the solution should be controlled so as to not cause clogging in the hole 26 by the silica sol. In this EXAMPLE, the silica sol concentration was controlled to not more than 0.3% by weight.

Subsequently, it was heated to 180° C. for 30 minutes to thereby convert the silica sol film into an $SiO_2$ film 2. This $SiO_2$ film 2 had a thickness of about several tens nm. After cooling to room temperature, the cover plate 27 was dipped in a solution prepared by diluting a solution of an ink repellent agent DEMNAM DSX (OPTOOL DSX, manufactured by Daikin Industries, Ltd.) with HFE-7200 (manufactured by 3M) to 0.1% by weight for 10 minutes and then heated to 120° C. for 20 minutes. The thus obtained ink repellent film 7 had a film thickness of 6 to 10 nm.

Since the ink repellent film 7 was formed on the overall face of the nozzle plate 27 at this point, the ink repellent film 7 on the face to be bonded to the nozzle plate 5 should be removed. The procedure for partly removing the ink repellent film 7 is not illustrated, since it can be carried out as in the case of the nozzle plate 5.

Although the nozzle plate 5 employed in this EXAMPLE had the ink repellent film 7 formed on the surface, use can be also made of a nozzle plate 5 having no ink repellent film on the surface.

As FIG. 9C shows, the nozzle plate 5 partly provided with the ink repellent film 7 was piled on the cover plate 27 in such a manner that the nozzle 6 and the hole 26 were located concentrically. Then, these parts were bonded by, for example, using an adhesive (see FIG. 7). In this EXAMPLE, the ink repellent film 7 around the hole 26 in the cover plate 27 had been removed as shown in FIG. 7.

FIGS. 10A to 10D are drawings for illustrating ink behaviors around the nozzle of the inkjet head according to the invention.

Figure 10A:
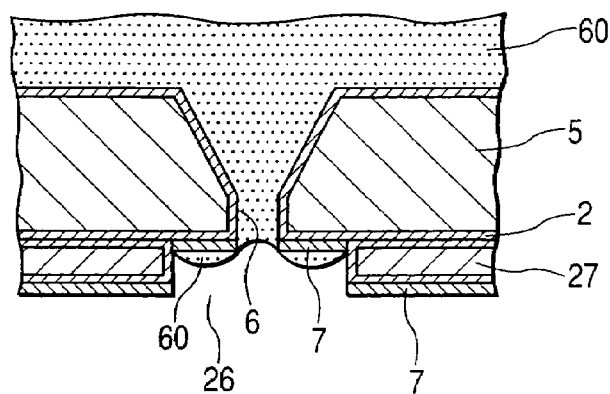
FIG. 10A to 10D presents a drawing for illustrating ink behaviors in the vicinity of the nozzle in the nozzle main body.

Due to ink suction or ink pressurization aiming at recovering a nozzle suffering from a jetting error or splashing caused by continuous jetting over a long time, an ink 60 is liable to be pooled around the opening of the nozzle 6, as shown in FIG. 10A.

Figure 10B:
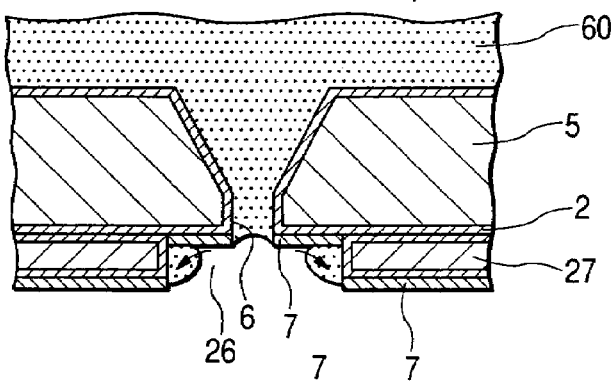

However, no ink repellent film 7 is formed in the vicinity of the hole 26 and this part has no ink repellence. When the ink comes into contact with this part, therefore, the ink is drawn and spread as shown in FIG. 10B. Then the ink 60 migrates close to the surface of the cover plate 27.

Figure 10C:
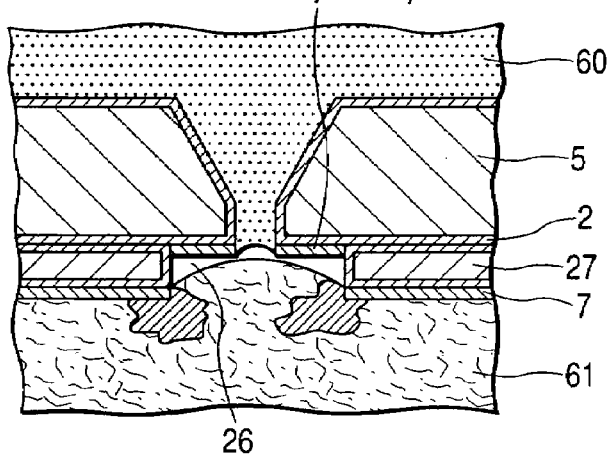
Figure 10D:
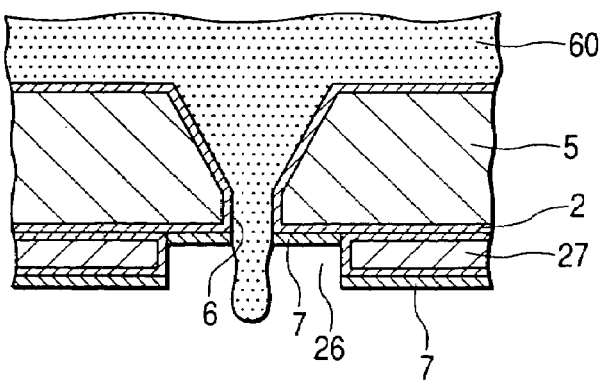

When an ink absorbent 61 made of, for example, nonwoven fabric is brought into contact with the surface of the cover plate 27 [see FIG. 10C], the ink 60 sticking to the surface in the vicinity of the cover plate 27 is quickly absorbed by the ink absorbent 61. Thus, the surface of the cover plate 27 can be easily cleansed. Owing to this system, ink droplets can be normally jetted from the nozzle 6, as shown in FIG. 10D.

As the results of the inventors' experiment, it is clarified that a diameter of the hole 26 larger by 4 to 8 times than the diameter D of the nozzle 6 is favorable while a thickness of the cover plate 27 larger by 0.4 to 1 time than the diameter D of the nozzle 6 is favorable.

EXAMPLE 12

Figure 11:
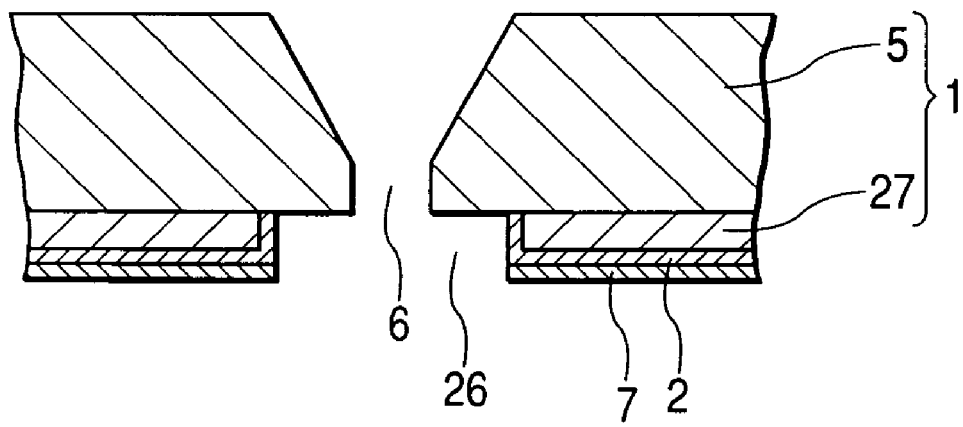
FIG. 11 presents a partly sectional view of the nozzle main body of EXAMPLE 12 according to the invention.

FIG. 11 is a drawing for illustrating EXAMPLE 12. This EXAMPLE is different from the EXAMPLE shown in FIG. 7 in having no ink repellent film 7 on the nozzle plate 5 but having an ink repellent film 7 exclusively on the surface of a cover plate 27 in the ink jetting side.

EXAMPLE 13

Figure 12:
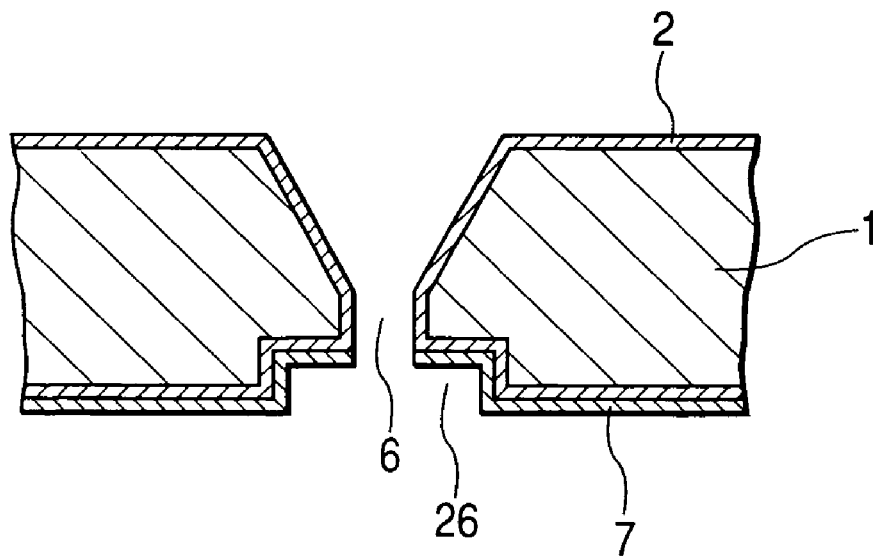
FIG. 12 presents a partly sectional view of the nozzle main body of EXAMPLE 13 according to the invention.

FIG. 12 is a drawing for illustrating EXAMPLE 13. This EXAMPLE is different from the EXAMPLE shown in FIG. 7 in using a nozzle main body 1 composed of a nozzle plate 5 and a cover plate 27 integrated together and an ink repellent film 7 being formed around a hole 26 too.

In the case of forming an $SiO_2$ film 2 in the ink channel side as in FIG. 2 or FIGS. 10A to 10D, the following effects can be established.

(1) Since the $SiO_2$ film has a hydrophilic nature, bubbles of an ink (in particular, a water base ink) can be easily discharged in the ink filling step and thus the ink can be smoothly filled.

(2) Since the $SiO_2$ film is highly stable chemically, it also serves as a protective film for protecting the nozzle main body from highly corrosive inks.

In the case of forming no $SiO_2$ film in the ink channel side, in contrast thereto, the following effects can be established.

(1) In the case of using an ink having a poor wettability for $SiO_2$ films, ink bubbles can be easily discharged in the ink-filling step and thus the ink can be smoothly filled when no $SiO_2$ film is formed.

(2) In the step of bonding a nozzle plate (a nozzle main body) provided with an $SiO_2$ film to an ink channel forming member (a pressure room plate), it is feared that no desired adhesion strength cannot be achieved and thus the $SiO_2$ film peels off from the nozzle plate (the nozzle main body). By bonding the nozzle plate (nozzle main body) directly to the ink channel-forming member, however, a high adhesion strength can be ensured.

(3) When the $SiO_2$ film peels off as in the above case, it is feared that the film remains as a foreign matter. In the case of forming no $SiO_2$ film in the ink channel side, this trouble never occurs.

(4) Since the $SiO_2$ film is formed only in a restricted area, the material cost can be lowered.

Figure 14:
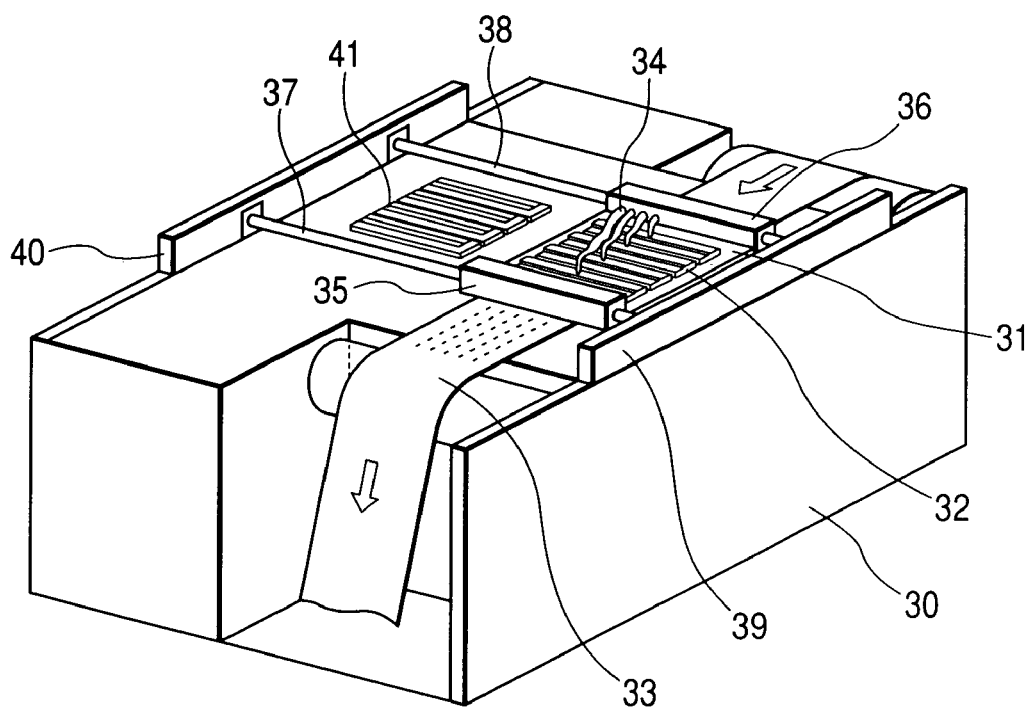
FIG. 14 presents a perspective view of an inkjet coater having this inkjet head thereon.

FIG. 14 presents a perspective view of an inkjet recorder having the inkjet head according to the invention. A head base 31 is located on a body 30 and a head set 32 having four heads is provided thereon. The body 30 contains a rolled paper transport unit, a controller, etc. inside, though which are not shown in the figure.

From four ink-feeding pipes 34 in the head set 32, inks of four types (cyan, magenta, yellow and black) are separately fed.

In each of the head set 32, for example, 20 inkjet heads are provided in the direction perpendicular to the longitudinal direction (transport direction) of the print paper 33. Each inkjet head has, for example, 128 nozzles 6 (shown in FIG. 2) are aligned. The print paper (roll paper) 33 is transported as being opposite to the nozzles and the above-described roll paper transport unit (not shown) is provided in the upstream.

Between frames 39 and 40 located above the body 30, rods 37 and 38 are formed. Supports 35 and 36 are supported by the rods 37 and 38 in a slidable manner and the head base 31 is attached between these supports 35 and 36. Therefore, the head set 32 is allowed to move in the direction perpendicular to the longitudinal direction (transport direction) of the print paper 33 for standby at the position of a head cleaning mechanism 41.

The inkjet head according to the invention is applicable to small-sized inkjet recorders for common use in addition to the above-described recorder.

Figure 15:
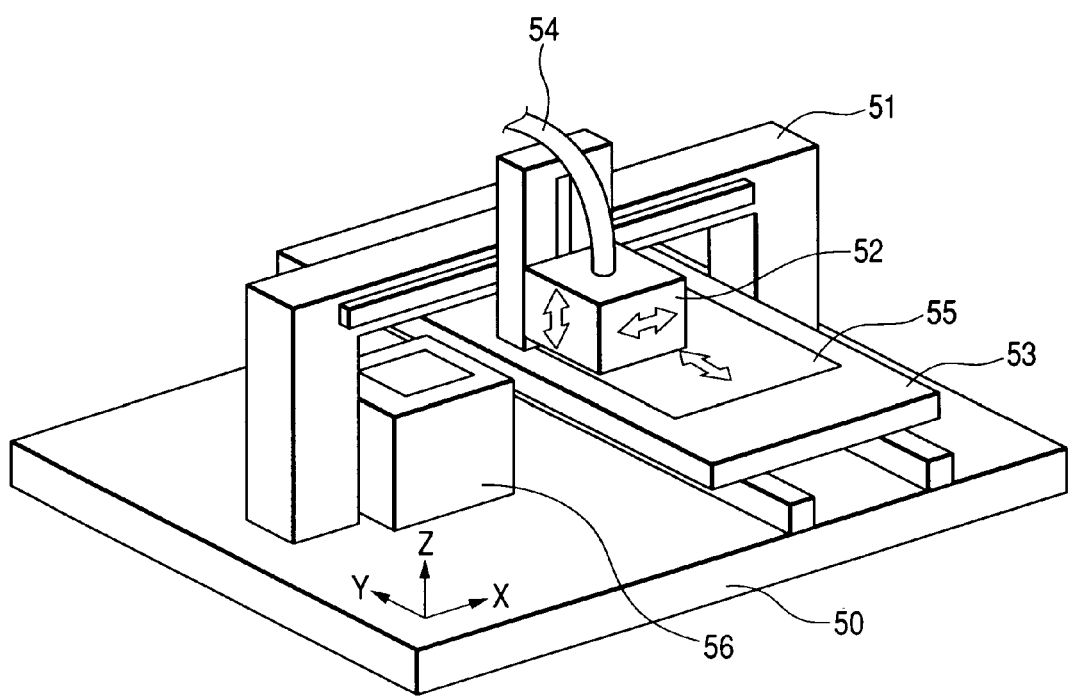
FIG. 15 presents a perspective view of an inkjet coater having this inkjet head thereon.

FIG. 15 presents a perspective view of an inkjet coater having the inkjet head according to the invention. A head base 51 is located on a base 50 and a head set 52 having one or more inkjet heads (see FIG. 13) is provided thereon. To the head set 52, a jetting solution is fed from a jetting solution feeding pipe 54. An inkjet receiver base 53 is provided opposite to the nozzles in the head set 52 and a coating substrate 55 on which a pattern, etc. is formed by the ink is set thereon.

In this EXAMPLE, the head set 52 is movable in the X- and Y-directions, while the inkjet receiver base 53 has a mechanism allowing it to move in the Y-direction. Owing to this constitution, an arbitrary pattern can be formed on the coating substrate 55. Although cut-sheets of plate, paper, film, etc. are employed as the coating substrate in the EXAMPLE, it is also possible to employ a continuous coating substrate and provide a transport unit therefor.

More specifically speaking, it is applicable to various patterning devices, for example, flat panel display production devices, three-dimensional modeling devices, print circuit board forming devices, fuel battery electrode forming devices and so on.

Although the formation of an SiO$_2$ film comprising SiO$_2$ alone is illustrated in the above EXAMPLES, it is also possible to employ an SiO$_2$ film comprising SiO$_2$ as the main component optionally or essentially together with other components. Examples of the other components include tetraethoxysilane, tetrabutoxysialne, ethyltriethoxysilane, butyltributoxysilane and so on.

Owing to the constitution as described above, the invention makes it possible to provide an inkjet head which is excellent in ink repellence and abrasion resistance not only for water base inks but also for oil base inks and solvent inks and sustains a high reliability and stable ink jetting even in using over a long time, compared with the conventional products.

The entire disclosure of each and every foreign patent application from which the benefit of foreign priority has been claimed in the present application is incorporated herein by reference, as if fully set forth.

What is claimed is:

1. An inkjet head for jetting an ink comprising:
   a nozzle main body formed of a metal material;
   a nozzle formed on the nozzle main body;
   an SiO$_2$ film containing an SiO$_2$ as a main component wherein the SiO$_2$ film is formed on at least a surface of an ink jetting side of the nozzle main body; and
   an ink repellent film formed from a compound having an alkoxysilane residue at an end of a perfluoro polyether chain wherein the ink repellent film is formed on the SiO$_2$ film,
   wherein an average surface roughness Ra of the nozzle main body is regulated to 0.13 μm or less.

2. The inkjet head according to claim 1,
   wherein the compound having an alkoxysilane residue at an end of a perfluoro polyether chain is a compound represented by formulae:

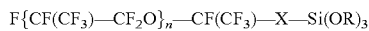

F{CF(CF$_3$)—CF$_2$O}$_n$—CF(CF$_3$)—X—Si(OR)$_3$

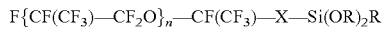

F{CF(CF$_3$)—CF$_2$O}$_n$—CF(CF$_3$)—X—Si(OR)$_2$R

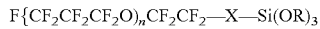

F{CF$_2$CF$_2$CF$_2$O}$_n$CF$_2$CF$_2$—X—Si(OR)$_3$

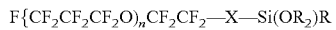

F{CF$_2$CF$_2$CF$_2$O}$_n$CF$_2$CF$_2$—X—Si(OR)$_2$R

[F{CF(CF$_3$)—CF$_2$O}$_n$CF(CF$_3$)]$_2$—Y—Si(OR)$_3$

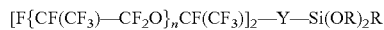

[F{CF(CF$_3$)—CF$_2$O}$_n$CF(CF$_3$)]$_2$—Y—Si(OR)$_2$R

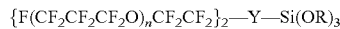

{F(CF$_2$CF$_2$CF$_2$O)$_n$CF$_2$CF$_2$}$_2$—Y—Si(OR)$_3$

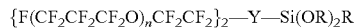

{F(CF$_2$CF$_2$CF$_2$O)$_n$CF$_2$CF$_2$}$_2$—Y—Si(OR)$_2$R wherein X and Y each represents a binding site of an alkoxysilane residue to a perfluoro polyether chain; and
   R represents an alkyl group.

3. The inkjet head according to claim 2,
   wherein the alkoxysilane residue is —Si(OR)$_3$.

4. The inkjet head according to claim 2,
   wherein each of the binding sites X and Y in the formulae respectively has a molecular structure represented by formulae:

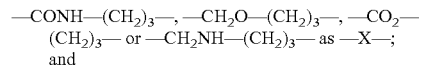

—CONH—(CH$_2$)$_3$—, —CH$_2$O—(CH$_2$)$_3$—, —CO$_2$—(CH$_2$)$_3$— or —CH$_2$NH—(CH$_2$)$_3$— as —X—;
   and

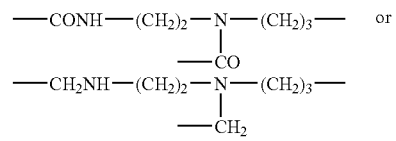

as —Y—.

5. The inkjet head according to claim 1,
   wherein the SiO$_2$ film is formed as extending in an ink channel side of the nozzle main body.

6. The inkjet head according to claim 1,
   wherein the SiO$_2$ film is formed as not extending in an ink channel side of the nozzle main body.

7. An inkjet recorder comprising:
   an inkjet head; and
   a transport unit for transporting a recording substrate in a definite direction,
   wherein an ink jetted from the inkjet head adheres to the recording substrate and thus data is recorded, and
   wherein the inkjet head is an inkjet head according to claim 1.

8. An inkjet coater comprising:
   an inkjet head; and
   a transport unit for transporting a coating substrate in a definite direction,
   wherein an ink jetted from the inkjet head adheres to the coating substrate, and
   wherein the inkjet head is an inkjet head according to claim 1.

* * * * *